United States Patent [19]

Hathaway et al.

[11] Patent Number: 5,757,657
[45] Date of Patent: May 26, 1998

[54] ADAPTIVE INCREMENTAL PLACEMENT OF CIRCUITS ON VLSI CHIP

[75] Inventors: David James Hathaway; John Maxwell Cohn. both of Chittenden County, Vt.

[73] Assignee: International Business Machines Corporation. Armonk, N.Y.

[21] Appl. No.: 597,743

[22] Filed: Feb. 7, 1996

[51] Int. Cl.$^6$ .................................................. H01L 21/98
[52] U.S. Cl. ............................................................. 364/491
[58] Field of Search ..................... 395/500; 364/488–491, 364/578

[56] References Cited

U.S. PATENT DOCUMENTS

| | | | |
|---|---|---|---|
| 4,377,849 | 3/1983 | Finger et al. | 364/491 |
| 4,686,629 | 8/1987 | Noto et al. | 364/491 |
| 4,882,690 | 11/1989 | Shinsha et al. | 364/490 |
| 4,908,772 | 3/1990 | Chi | 364/491 |
| 4,918,614 | 4/1990 | Modarres et al. | |
| 4,975,854 | 12/1990 | Yabe | 364/491 |
| 5,050,091 | 9/1991 | Rubin | 364/488 |
| 5,097,422 | 3/1992 | Corbin, II et al. | 364/491 |
| 5,164,907 | 11/1992 | Yabe | 364/491 |
| 5,231,590 | 7/1993 | Kumar et al. | 364/491 |
| 5,308,798 | 5/1994 | Brasen et al. | 437/250 |
| 5,311,443 | 5/1994 | Crain et al. | 364/491 |
| 5,355,322 | 10/1994 | Yamashita et al. | 364/490 |
| 5,371,684 | 12/1994 | Iadonato et al. | 364/491 |
| 5,416,720 | 5/1995 | Fukui | 364/489 |
| 5,513,119 | 4/1996 | Moore . | |
| 5,579,237 | 11/1996 | Shibuya et al. | 364/491 |

OTHER PUBLICATIONS

Pedram, "An Integrated Approach to Logic Synthesis and Physical Design", SRC Technical Report Number T91133, Sep. 1991, pp. i–156.

*Primary Examiner*—Kevin J. Teska
*Assistant Examiner*—Dan Fiul
*Attorney, Agent, or Firm*—Whitham, Curtis & Whitham; Alison D. Mortinger

[57] ABSTRACT

A computer implemented method incrementally updates a design placement in a very large scale integrated (VLSI) chip. A data structure is generated which defines a chosen specification and initial placement of circuits is input to a computer aided design (CAD) system. The CAD system divides a design area into placement cells. Local constraint values and limits are computed and changes made in the design specification. Replacement regions are then identified, expanded, and replaced. Constraint values are recomputed and the steps of the method are repeated until no more changes are required.

19 Claims, 5 Drawing Sheets

FIG.3A

| A c=10 o=7 | B c=10 o=6 | C c=8 o=8 |
|---|---|---|
| D c=10 o=9 | E c=10 o=6 | F c=8 o=7 |

| G c=10 o=7 | H c=10 o=8 | I c=10 o=10 | J c=10 o=9 | K c=10 o=14 | L c=10 o=7 |
|---|---|---|---|---|---|
| M c=10 o=5 | N c=10 o=7 | O c=10 o=7 | P c=10 o=12 | Q c=10 o=8 | R c=10 o=6 |

FIG.3B

| A c=10 o=7 | B c=10 o=6 | C c=8 o=8 |
|---|---|---|
| D c=10 o=9 | E c=10 o=6 R1 | F c=8 o=7 R1 |

| G c=10 o=7 | H c=10 o=8 | I c=10 o=10 R1 | J c=10 o=9 R1 | K c=10 o=14 R2 | L c=10 o=7 |
|---|---|---|---|---|---|
| M c=10 o=5 | N c=10 o=7 | O c=10 o=7 | P c=10 o=12 R3 | Q c=10 o=8 | R c=10 o=6 |

| A      | B      | C     |
|--------|--------|-------|
| c=10   | c=10   | c=8   |
| o=7    | o=6    | o=8   |

| D      | E      | F     |
|--------|--------|-------|
| c=10   | c=10   | c=8   |
| o=9    | o=6    | o=7   |
|        | R1'    | R1'   |

| G    | H    | I    | J    | K    | L    |
|------|------|------|------|------|------|
| c=10 | c=10 | c=10 | c=10 | c=10 | c=10 |
| o=7  | o=8  | o=10 | o=9  | o=14 | o=7  |
|      | R1'  | R1'  | R1'  | R2'  |      |

| M    | N    | O    | P    | Q    | R    |
|------|------|------|------|------|------|
| c=10 | c=10 | c=10 | c=10 | c=10 | c=10 |
| o=5  | o=7  | o=7  | o=12 | o=8  | o=6  |
|      |      |      | R3   |      |      |

FIG.4A

| A      | B      | C     |
|--------|--------|-------|
| c=10   | c=10   | c=8   |
| o=7    | o=6    | o=8   |

| D      | E      | F     |
|--------|--------|-------|
| c=10   | c=10   | c=8   |
| o=9    | o=6    | o=7   |
|        | R2'    | R2'   |

| G    | H    | I    | J    | K    | L    |
|------|------|------|------|------|------|
| c=10 | c=10 | c=10 | c=10 | c=10 | c=10 |
| o=7  | o=8  | o=10 | o=9  | o=14 | o=7  |
|      | R2'  | R2'  | R2'  | R2'  |      |

| M    | N    | O    | P    | Q    | R    |
|------|------|------|------|------|------|
| c=10 | c=10 | c=10 | c=10 | c=10 | c=10 |
| o=5  | o=7  | o=7  | o=12 | o=8  | o=6  |
|      |      |      | R3   |      |      |

FIG.4B

| A<br>c=10<br>o=7 | B<br>c=10<br>o=6 | C<br>c=8<br>o=8 | | | |
|---|---|---|---|---|---|
| D<br>c=10<br>o=9 | E<br>c=10<br>o=6<br>R3' | F<br>c=8<br>o=7<br>R3' | | | |
| G<br>c=10<br>o=7 | H<br>c=10<br>o=8<br>R3' | I<br>c=10<br>o=10<br>R3' | J<br>c=10<br>o=9<br>R3' | K<br>c=10<br>o=14<br>R3' | L<br>c=10<br>o=7 |
| M<br>c=10<br>o=5 | N<br>c=10<br>o=7<br>R3' | O<br>c=10<br>o=7<br>R3' | P<br>c=10<br>o=12<br>R3' | Q<br>c=10<br>o=8<br>R3' | R<br>c=10<br>o=6 |

FIG.4C

ADAPTIVE INCREMENTAL PLACEMENT OF CIRCUITS ON VLSI CHIP

BACKGROUND OF THE INVENTION

1. Field of the Invention

The present invention generally relates to very large scale integrated (VLSI) chip design, and more particularly, to a computer implemented method of reworking logic circuit placement on the chip after modification due to logic and/or timing changes.

2. Background Description

Traditionally, the various steps in the design of a VLSI chip have been done sequentially; that is, the high level design is done, followed by logic synthesis, circuit placement, and finally wiring. The process is carried out using known computer aided design (CAD) techniques. This sequential process is relatively inflexible. If, for example, circuit changes are made after the high level design is completed, full-chip replacement may be necessary. Thus, one problem with this approach is that information from several of these steps may be needed to select the best alternative for many design decisions. For example, logic factoring, typically done in logic synthesis, would best be done considering both the sharing of logical functions, and the physical location of the sources of the candidate signals for factoring. But the traditional sequential design flow makes this impossible.

To fix this problem, the design steps must somehow be merged. Some work is being done in this area, by first doing placement of the technology independent design, making factoring decisions based on this placement, and updating the placement based on the factoring decisions made. But the incremental placement used only considers local connections to the circuit(s) whose connections are being modified. After a large number of such factorings and incremental placements, the global criteria which were optimized by the original placement may "drift" far from the optimum. This can be fixed during a final "placement relaxation" step, but because the placement toward the end of the factoring process may have been bad, the factoring decisions made based on it may also have been bad.

Another option is to periodically redo the entire global placement during the factoring process, but without a clear criterion to determine when this should be done, we may either redo the placement more often than is really needed or defer too long and make decisions based on bad placement.

This invention overcomes these problems and can be used to incrementally update placement during any design process which makes repeated design changes (e.g., net list changes) whose individual effects locally affect the placement.

SUMMARY OF THE INVENTION

It is therefore an object of the present invention to provide a computer implemented method to incrementally update a design placement.

According to the invention, a data structure is generated which defines a chosen specification and initial placement of circuits. This data structure is input to the CAD system which divides a design area into placement cells. Constraint values for placement cells are updated and compared against limits after changes are made in the designs specification. Replacement regions are then identified and expanded, and the circuits within them are replaced. Constraint values are recomputed and the steps of the inventive method are repeated until no more changes are required.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A and 3B show the generation of initial replacement regions; and

FIGS. 4A, 4B and 4C show the expansion of replacement regions.

DETAILED DESCRIPTION OF A PREFERRED EMBODIMENT OF THE INVENTION

This invention operates on a design with circuit placement assigned, to which changes are made which have a local effect on the optimal circuit placement (e.g., adding or deleting net connections, or changing the size of a circuit). The method used for the original placement does not matter, nor do the types of changes made to the design, as long as the circuits whose placements should be updated for any given change can be identified (e.g., those connected to nets which have had connections added or deleted).

Figure 1:
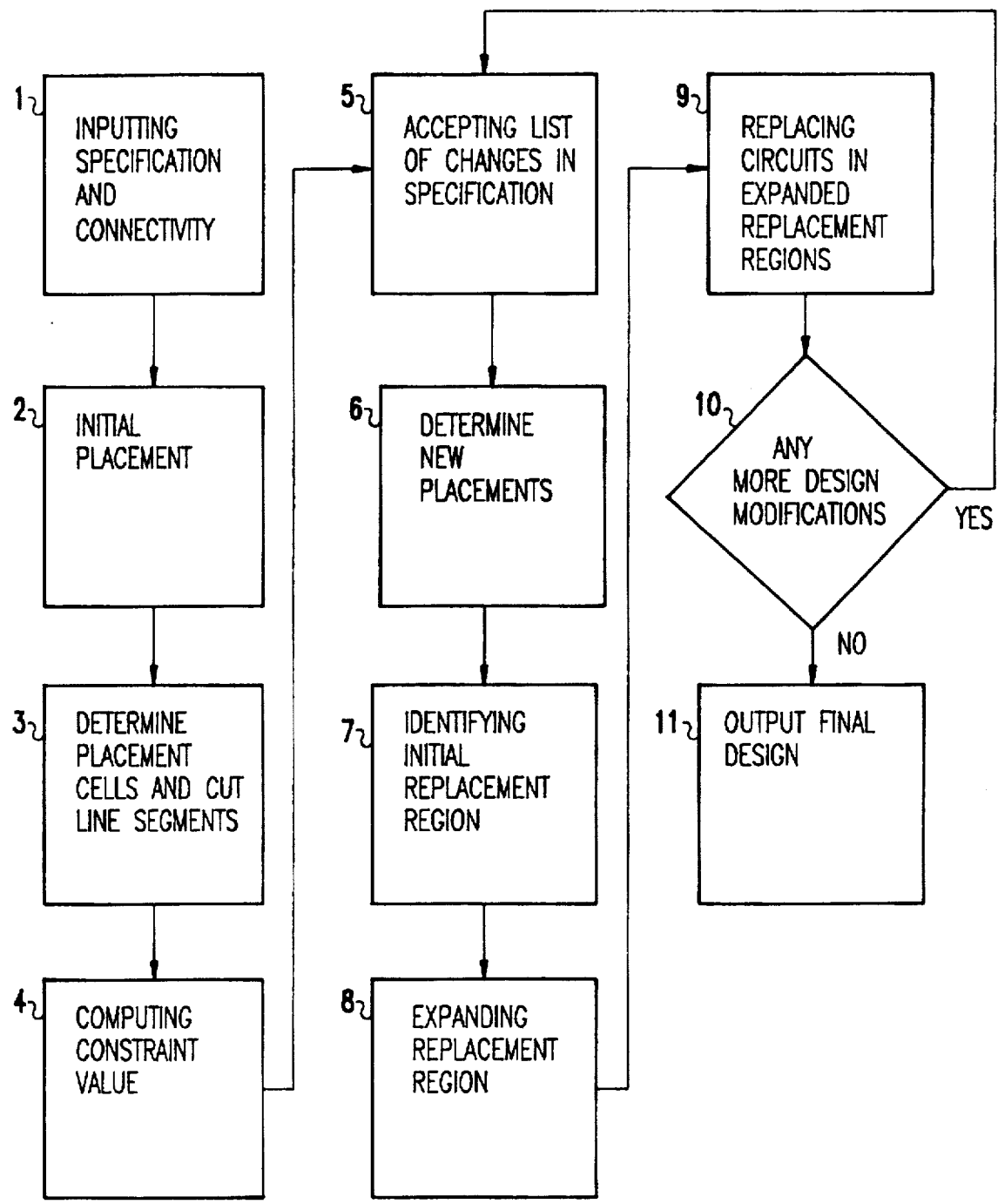
FIG. 1 is flow chart showing the steps of the invention.

Referring now to the drawings, and more particularly to FIG. 1, there is shown a flow chart depicting the steps of the invention. The first step, shown in block 1, is to input specification data of the circuits in a design and connectivity for the circuits, and data defining an area in which the circuits may be placed. In the second step, shown in block 2, an initial placement of the circuits in a specified area is performed.

The initial placement will be performed by a placement program. Examples of such programs include MCplace, Qplace, Timberwolf, Proud, and Gordian. The data structure input to the program generally includes a netlist and a placement for each circuit in the netlist. One class of placement programs which might be used operates by dividing the design area into two (or more) smaller regions, and then assigning the circuits to these subregions so as to minimize the number of connections required between the different regions. Each of these subregions and the circuits within them are then divided and assigned in a similar manner. This is repeated until each circuit has been assigned a specific location, or until the regions reach some minimum size, at which point some other placement legalization process takes over. These methods are generally known as cut-tree, or bisection placement methods.

The netlist is typically a list of nets, a list of circuits, each with a sublist of the pins on the circuit, and for each pin a specification of the net connected to that pin. The placement of a circuit would typically be the X and Y coordinates on the chip at which the circuit is to be placed. One common netlist format, which can also include placement information, is electronic data interchange format (EDIF).

This input data structure may then be stored in different ways internally to the program. For example, a named reference to a net would typically be replaced by a memory pointer to the data structure representing the net. The placement information might be augmented by structures such as a quad-tree or k-D tree (both well known in the field) to make it easier to search for circuits by location.

The novel steps of the invention begin in block 3 where a set of placement cells into which the design area can be divided and a set of cut line segments which divide adjacent pairs of these placement cells are determined. This occurs before the incremental changes begin. To accomplish this, the design area is divided into roughly equal sized placement cells, which should be constructed so that each placement cell has at most one other placement cell above, below, to the right, and to the left of it. The line dividing two placement cells is called a cut line segment.

Figure 2:
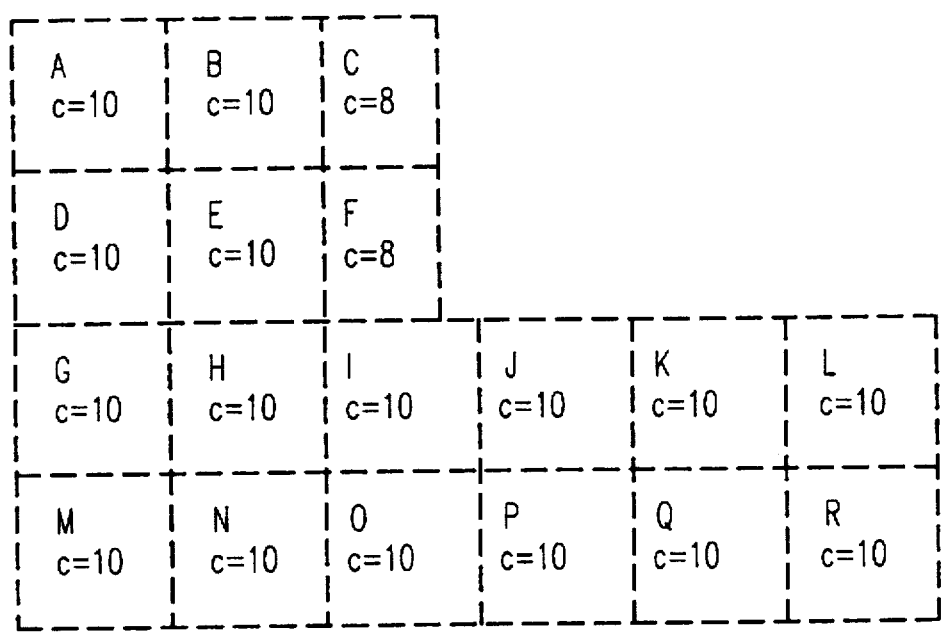
FIG. 2 shows placement cells for a nonrectangular design.

Placements within non-rectangular design areas are allowed. Such a configuration is shown in FIG. 2. In FIG. 2, a nonrectangular design area has been divided into roughly equal placement cells, and the maximum occupancy of each is labeled as parameter "c" (no minimum occupancies are specified). Cell sizes need not be exactly equal. For example, cells C and F have a maximum occupancy of eight while all others in FIG. 2 have a maximum occupancy of ten. The difference in size will not interfere with the process.

The fourth step of the invention, shown as block 4 in FIG. 1, is to compute at least one constraint value on each of the determined placement cells and cut line segments, and the allowed limits on these constraint values. These local constraints are designed to insure that if all of them are met, undesirable global placement characteristics, such as areas of wiring congestion or circuit overcrowding, are prevented. The current occupancy of each placement cell is recorded, stating the total size of the circuits within that node. A minimum and maximum allowed occupancy is recorded as well. These occupancy limits will be used later to determine how much the placement needs to be modified when an incremental change is made. With each placement cell, record the placement cell immediately above, below, to the left, and to the right of it, as well as the current occupancies (number of connections crossing a cut line segment) and maximum capacities of the cut line segments separating the node from each of these other nodes.

The occupancy of these cut line segments may be computed by any of a variety of methods used for estimating wiring congestion. For example, it may be computed by assigning specific terminal locations to all nets which must cross those cut line segments, based on some estimated routing. Alternatively, it may be computed by estimating for each interplacement cell connection the probability that it will cross various cut line segments, based on a family of possible routings.

The fifth step is shown in block 5 of FIG. 1. A list of at least one change in the design specification is accepted. After each incremental design change affecting placement, accept a list of circuits whose placement should be updated (e.g., as result of a change in the netlist). This includes specifying circuits which have been deleted and those which have been added.

The sixth step, shown in block 6, then proceeds, by determining new placements for each of the circuits directly affected by these accepted placement changes. When a request is made requiring placement information, "good" placements for all circuits which have been identified as requiring their placement to be updated are found, based only on local characteristics (e.g., the locations of the circuits to which they are connected which are not having their placements updated). This could be done by a variety of methods, such as quadratic cost optimization. This step may or may not create overlaps or illegal placements, depending on the degree of precision desired in the resulting placement, and as a result, may include movement of other circuits to make room for the circuits being placed.

These "good" placements are found for the changed circuits based only on the local characteristics in order to speed processing. But because only local characteristics are considered, these placements may adversely affect the global characteristics of the placement. Therefore, the following steps seven through ten of FIG. 1 determine whether such an adverse effect occurred, and if so, correct it.

In the seventh step, shown in block 7, initial replacement regions are identified. The occupancy of each placement cell to which a circuit has been added since the last placement update, or from which one has been deleted, is updated. The occupancy of all cut line segments between placement cells which have had connections added or deleted as a result of the addition, deletion, or replacement of circuits since the last placement update are updated.

Updating of the cell occupancy may be performed by considering only the circuits added to or deleted from each placement cell, and respectively adding or subtracting those circuit areas from the previous occupancy. Similarly, updating of the cut line segment occupancy based on specific net routes may be performed by adding the tracks required by nets which now cross the cut line segment and previously did not, and subtracting the number of tracks required by nets which previously crossed the cut line segment and now do not. Updating of cut line segment occupancies based on probabilistic net routes may be performed by adding the change in the probability of crossing the cut line segment for each net for which this probability has changed as a result of the placement changes (e.g., each net connected to a pin on a circuit which has moved).

Identifying regions of the design which will be replaced is accomplished by defining initial replacement regions. A placement cell is assigned to an initial replacement region if its occupancy is outside of the allowed range, or if it is bordered by a cut line segment which is over capacity. Two adjacent placement cells are assigned to the same initial replacement region if the cut line segment which separates them is over capacity.

FIGS. 3A and 3B show the generation of initial replacement regions. FIG. 3A depicts the design of FIG. 2 after some changes have been made and the placement cell and cut line segment occupancies have been updated. The occupancy of each placement cell has been indicated with parameter "o". As in FIG. 2, the maximum occupancy of each placement cell is labeled as parameter "c". The "OOO" on the cut line segments between placement cells E and F, F and I, and I and J indicate that these cut line segments are over capacity.

Similarly, the "X" in placement cells P and K indicate that the occupancies of these placement cells are outside the allowed range. FIG. 3B depicts the initial replacement regions determined as a result. Placement cells E, F, I, and J, are all in a single initial replacement region R1, because they are connected by cut line segments which are over capacity. Placement cells K and P are each in separate initial replacement regions R2 and R3, respectively, because they are not connected to any other placement cells by cut line segments which are over capacity.

In the eighth step, shown in block 8 of FIG. 1, the initial replacement regions are expanded into expanded replacement regions, each of whose contents will subsequently be replaced. The objective is to keep the replacement regions small to minimize the processing required in replacing them, while insuring that they are large enough that their replacement can be expected to solve the problems (placement cells whose occupancy is outside the allowed occupancy limits and cut line segments which are over capacity) contained in them. This expansion is performed growing the initial replacement regions, that is, by adding placement cells to them.

In growing a replacement region, we will determine a set of possible expansions for the region. For each alternative a cost function will be evaluated, and the expansion having the smallest cost will be chosen. Each placement cell will be assigned to at most one expanded replacement region, so that for a replacement region to grow to include a placement cell in another replacement region, the two replacement regions must be merged. This process of determining possible expansions and selecting among them will be repeated until some stopping criterion is met.

The following considerations may be included in the choosing of possible expansions for a replacement region, in the evaluation of the cost function used to choose between alternative candidate expansions, and/or as components in a possibly composite stopping criterion. The relative weighting of the different components of the cost function will be predetermined in some manner, probably through selection by the user.

a) Insure that the total occupancy of each replacement region be within the total occupancy limits for the placement cells within it. This consideration may be used in a cost function by including a term related to the amount of excess occupancy over the sum of the placement cell maximum occupancy limit or to the amount by which the cell occupancy falls short of the sum of the placement cell minimum occupancy limit (if any). It may also be included in the stopping criterion by requiring that the total placement cell occupancy of the replacement region fall within its occupancy limits.

b) Create rectangular regions. This may be required by the placement method used in the subsequent replacement step, and will in any case tend to insure that the wiring needed to communicate between circuit usages within the replacement region will itself be included in (and therefore accounted for in) the replacement region. If the total design area is not rectangular, this expansion consideration could include creation of partial rectangular regions, that is, regions which would be rectangles except for truncation by the outer boundary of the design area. This consideration can be used as a candidate selection mechanism by selecting placement cells which complete the bounding rectangle of a replacement region. It can be included in the cost function by adding a constant penalty if the replacement region is not rectangular, or by adding a term related to the number of placement cells which are included in the bounding rectangle of the replacement region but are not included in the replacement region. And it can be used as a stopping criterion by requiring that all replacement regions be rectangles.

c) Attempt to reduce the aspect ratio of the replacement regions. The aspect ratio of a region is the maximum of its height and width divided by the minimum of its height and width. Reducing this ratio reduces the perimeter to area ratio, and thus reduces the effect of replacement of the region on its neighbors. This consideration can be used as a candidate selection mechanism by choosing an expansion which adds a row of placement cells along the longer edge of the replacement region to be expanded. It can be included in the cost function by including a term related to the aspect ratio of the replacement region. It can also be included in the stopping criterion by requiring that the aspect ratio of each replacement region be less than some limit.

d) Attempt to merge replacement regions, both to reduce the number of replacement regions to be considered and to reduce the constraints imposed on the subsequent replacement step. This consideration can be used as a candidate selection mechanism by choosing an expansion which merges adjacent replacement regions. It can also be included in the cost function by subtracting some amount from the cost for candidate expansions which merge two replacement regions.

e) Include placement cells whose occupancies were close to the allowed occupancy limit. This will tend to delay the need to replace these placement cells later due to occupancy limit violations. This can be used as a candidate selection mechanism by choosing expansions which add the bordering placement cell(s) that are closest to their occupancy limits. It can also be included in the cost functions by adding a term related to the amount of leeway the added placement cells had between their current occupancy and their occupancy limits.

f) Include placement cells bordering cut line segments which are close to their capacity. This will tend to delay the need to replace these placement cells later due to cut line segment capacity violations. This can be used as a candidate selection mechanism by choosing expansions which add the bordering placement cell(s) which are separated from the replacement region by cut line segments that are closest to their capacities. It can also be included in the cost function by adding a term related to the difference between the capacity and occupancy of the cut line segments separating the original replacement region from the placement cells being added.

g) Try to keep the total occupancy of each replacement region near a target occupancy. This target occupancy would be the sum of the target occupancies for the constituent placement cells. An individual placement cell target occupancy could be the middle of its occupancy range, or could be chosen to make the proportional occupancy of all placement cells in the design area equal. This will tend to cause the occupancy of each placement cell in the replacement region to be near its target occupancy after the subsequent replacement step, thus delaying the need to replace these placement cells later due to occupancy limit violations. This consideration can be used as a candidate selection mechanism by choosing expansions which add low occupancy placement cells to replacement regions whose occupancies exceed their occupancy target, and which add high occupancy placement cells to replacement regions whose occupancies are less than their occupancy target. It can also be included in the cost function by adding a term related to how far the replacement region occupancy is from its target occupancy.

h) Include placement cells which complete a node in a cut tree, if the original placement was based on a bisection (cut tree) method. This may allow some of the data structures used in the original placement step to be reused during the replacement step. This may be used as a candidate selection mechanism by determining the common ancestor in the cut-tree of all placement cells currently in the replacement region, and selecting expansions which preferentially add to a replacement region those placement cells that are also descendants in the cut-tree of that common ancestor. It may also be included in the cost function by adding a term related to the size (number of descendants) of the common cut-tree ancestor of all placement cells in the replacement region, and/or a term related to the number of descendants of the common cut-tree ancestor which are not included in the replacement region.

It will be understood that variations on the manner in which these considerations are used as candidate selection methods, as contributors to a cost function, and as stopping criteria are possible, and that other considerations may also be employed in each of these capacities. It will also be understood that the steps of candidate selection, cost function evaluation, and stopping point determination may be combined using well-known methods for traversing and pruning a large search space.

In the following discussion, the terms "rectangle" and "rectangular" should be understood to include both regions which are actual rectangles, and regions which are rectangles truncated by the outer boundaries of the design area. To expand the initial replacement regions shown in FIG. 3B, we will use a candidate selection criterion which expands the replacement region to fill its bounding rectangle if it does not already do so. If the replacement region is already rectangular, we will choose expansion candidates which add an adjacent row or column to the replacement region. If such an addition intersects one or more other replacement regions, the candidate expansion will include all placement cells in the bounding rectangle containing the original replacement region and all the intersected replacement regions. The cost function used to select among alternative expansion candidates will be the aspect ratio of the new replacement region minus the number of other replacement regions merged into it for that candidate. The stopping criteria will be that each replacement region be rectangular, and that the sum of the occupancies of the placement cells in each replacement region is less than the sum of the maximum occupancies of the placement cells in the replacement region. We will visit each initial replacement region in turn, expanding it until the stopping criteria are met.

We begin by examining region 1 in FIG. 3B. It is not rectangular, so we must expand it. We generate a single candidate expansion which makes it rectangular, by adding placement cell H. Because this is the only candidate, the cost function need not be evaluated, and the candidate expansion is accepted yielding expanded region R1' as shown in FIG. 4A. Because replacement region R1' is rectangular, and its total occupancy of 40, is less than its capacity (the sum of the capacities of its constituent placement cells) of 48, we need not further expand replacement region R1'.

We now proceed to region R2, which is rectangular, but whose total occupancy of 14 exceeds its capacity of 10, and must therefore be expanded. Three candidate expansions, E1, E2, and E3 are generated which add placement cells J, Q, and L, respectively. Because placement cell J is already part of replacement region R1', candidate expansion E1 must be modified to include E, F, H, I, and J, which are all placement cells in the bounding rectangle of replacement regions R1' and R2. The aspect ratio for expansion E1 is 4/2=2, and the number of replacement regions merged in is 1, for a total cost of 2−1=1. The aspect ratio for expansion E2 is 2/1=2, and the number of replacement regions merged in is 0, for a total cost of 2=0=2. The aspect ratio for expansion E3 is 2/1=2, and the number of regions merged in is 0, for a total cost of 2−0=2. Expansion E1 is chosen because it has the lowest cost, yielding the expanded replacement region R2' as shown in FIG. 4B. Because replacement region R2' is rectangular, and its total occupancy of 54, is less than its capacity (the sum of the capacities of its constituent placement cells) of 58, we need not further expand replacement region R2'.

We now proceed to region R3 which is rectangular, but whose total occupancy of 12 exceeds its capacity of 10, and must therefore be expanded. Three candidate expansions, E1, E2, and E3 are generated which add placement cells J, O, and Q, respectively. Because placement cell J is already part of replacement region R2', candidate expansion E1 must be modified to include E, F, H, I, J, K, N, O, and Q, which are all placement cells in the bounding rectangle of replacement regions R2' and R3. The aspect ratio for expansion E1 is 4/3, and the number of replacement regions merged in is 1, for a total cost of 4/3−1=1/3. The aspect ratio for expansion E2 is 2/1=2, and the number of replacement regions merged is in 0, for a total cost of 2−0=2. The aspect ratio for expansion E3 is 2/1=2, and the number of replacement regions merged is in 0, for a total cost of 2−0=2. Expansion E1 is chosen because it has the lowest cost, yielding the expanded replacement region R3' as shown in FIG. 4C. Because replacement region R3' is rectangular, and its total occupancy of 88, is less than its capacity (the sum of the capacities of its constituent placement cells) of 98, we need not further expand replacement region R3'. No other initial replacement regions exist to be checked or expanded, so we now proceed to the next step.

In the ninth step, shown in block 9 of FIG. 1, the circuits in each of the expanded replacement regions identified in the previous step are replaced, and the occupancies of the placement cells and cut line segments they contain are updated. Any placement method can be used for this step. If, after the replacement of a replacement region, some placement cell occupancy limit or cut line segment capacity violations still exist, the replacement region may be further expanded and the replacement repeated.

Step ten, shown in decision block 10, determines whether any additional changes are to be made to the design. If so, processing returns to step five to accept and process the next set of changes. Otherwise, processing terminates and the final design is output, as shown in block 11.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method of incrementally placing circuits on a two dimensional design area comprising the steps of:

a) inputting a specification of said circuits in a design and a connectivity for said circuits, and of said design area in which said circuits may be placed;

b) performing an initial placement of said circuits in said design area;

c) determining a set of placement cells into which said design area can be divided, and a set of cut line segments dividing adjacent pairs of these placement cells;

d) determining a set of local constraints;

e) accepting a list of at least one change in the design specification;

f) determining new placements for each of the circuits directly affected by these accepted placement changes;

g) identifying initial replacement regions for which said local constraints were violated;

h) expanding said initial replacement regions according to a cost function until a stopping condition is met;

i) replacing the circuits in each of the expanded replacement regions; and j) repeating steps e) through i) until no more changes in design specification are required.

2. The computer implemented method of claim 1, wherein the step of determining a set of local constraints comprises determining at least one constraint on each of the determined placement cells.

3. The computer implemented method of claim 1, wherein the step of determining a set of local constraints comprises determining at least one constraint on each of the determined cutline segments.

4. The computer implemented method of claim 2, wherein the placement cell constraint includes requiring the total area within the placement cell occupied by circuits to be between some minimum and maximum capacities.

5. The computer implemented method of claim 3, wherein the cut line segment constraint includes requiring the number of connections crossing each cut line segment to be less than some maximum.

6. The computer implemented method of claim 1, wherein said step of expansion generates a region which is a rectangle with an aspect ratio less than some maximum limit, or a partial rectangle in the event of an overlap with an inside corner of said design area, where said design area is non-rectangular.

7. The computer implemented method of claim 1, wherein said initial placement is done by a bisection method which determines a cut tree whose leaves are the placement cells, and in which the expansion step preferentially adds to a replacement region cells which complete a sub tree of this cut tree.

8. The computer implemented method of claim 4, wherein said stopping condition includes requiring that the sum of the areas occupied by the circuits in the replacement regions be between the sum of the minimum capacities of the placement cells in the replacement region and the sum of the maximum capacities of the placement cells in the replacement region.

9. The computer implemented method of claim 1, wherein said placement cells are determined by a rectangular grid, such that each placement cell has at most one placement cell immediately above it, at most one placement cell immediately below it, at most one placement cell immediately to the right of it, and at most one placement cell immediately to the left of it.

10. The computer implemented method of claim 1, wherein said expansion step preferentially expands a replacement region in such a way that the replacement regions are merged.

11. The computer implemented method of claim 2, wherein said cost function includes at least one term that is minimized by inclusion of placement cells that are closest to violating their constraints.

12. The computer implemented method of claim 3, wherein said cost function includes at least one term that is minimized by inclusion of placement cells on both sides of cut line segments that are closest to violating their constraints.

13. The computer implement method of claim 1, wherein the step of determining a set of local constraints comprises computing a set of local constraint values and the allowed limits on said local constraint values and the step of identifying initial replacement regions comprises determining whether said local constraint values exceed said allowed limits.

14. The computer implemented method of claim 13, wherein the step of determining new placements includes recomputing said local constraint values, and the step of replacing the circuits includes recomputing said local constraint values.

15. The computer implemented method of claim 13, wherein said expansion step preferentially expands a replacement region to keep the sum of said local constraint values for the replacement region as far as possible from the sum of said allowed limits for the replacement region.

16. A computer implemented method of modifying portion of an existing placement in response to changes in characteristics of the design which affect placement, including circuit selection and connectivity, and which includes a means to correct accumulated errors in global characteristics of the placement, including circuit density and wirability due to a series of placement changes.

17. A method for designing a semiconductor chip, comprising the steps of:

a) defining a global placement constraint that must not be violated;

b) creating a netlist which identifies circuits and connections between the circuits to define a circuit network;

c) assigning locations to the circuits in the circuit network onto a map of the semiconductor chip based upon the netlist;

d) making local placement change to the circuit network;

e) testing the semiconductor chip map to identify a global placement constraint violation;

f) defining a solution region on the semiconductor chip map that contains the global constraint violation and an additional area sufficient to allow for a correction of the global constraint violation; and g) assigning new semiconductor chip map locations to the circuits located in the solution region.

18. A computer implemented method for incrementally updating the placement of circuits in a circuit network comprising the steps of;

a) inputting a netlist describing the circuit network;

b) placing all the circuits in said circuit network;

c) accepting at least one local change to said circuit network placement, said change optionally to include changes to the circuits and connections of said circuit network;

d) testing for global constraint violations on said circuit network placement which are now violated as a result of said local change in said circuit network placement;

e) defining regions of said circuit network placement in which circuits need to be replaced in order to correct said identified global placement constraint violations; and f) replacing the circuits in said defining regions.

19. A computer implemented semiconductor chip design method comprising the steps of:

establishing a global constraint, wherein violation of said global constraint determines the need for replacing a portion of the chip;

making a local change to the placement;

determining whether said local change caused said global constraint to be violated; and if said global constraint is violated, identify a region of the chip whose replacement would cause said global constraint not to be violated and replace said region.

* * * * *